(12) United States Patent
Nishikawa et al.

(10) Patent No.: US 7,061,174 B2
(45) Date of Patent: Jun. 13, 2006

(54) ELECTROLUMINESCENT DISPLAY DEVICE

(75) Inventors: Ryuji Nishikawa, Gifu (JP); Kazuyuki Maeda, Aichi (JP)

(73) Assignee: Sanyo Electric Co., LTD, Osaka (JP)

( * ) Notice: Subject to any disclaimer, the term of this patent is extended or adjusted under 35 U.S.C. 154(b) by 156 days.

(21) Appl. No.: 10/758,597

(22) Filed: Jan. 16, 2004

(65) Prior Publication Data

US 2004/0207570 A1 Oct. 21, 2004

(30) Foreign Application Priority Data

Jan. 21, 2003 (JP) .............................. 2003-012382

(51) Int. Cl.
*H05B 33/22* (2006.01)

(52) U.S. Cl. ...................... 313/500; 313/504

(58) Field of Classification Search ................ 313/504, 313/506, 507, 508, 509, 500
See application file for complete search history.

(56) References Cited

U.S. PATENT DOCUMENTS

| | | | |
|---|---|---|---|
| 2001/0050532 A1* | 12/2001 | Eida et al. ................... 313/504 |
| 2002/0063518 A1* | 5/2002 | Okamoto et al. ........... 313/506 |
| 2002/0113546 A1* | 8/2002 | Seo et al. .................... 313/504 |
| 2002/0192576 A1* | 12/2002 | Matsuoka et al. ............. 430/7 |
| 2003/0098645 A1* | 5/2003 | Lee et al. .................... 313/504 |
| 2003/0214248 A1* | 11/2003 | Jinno ...................... 315/169.3 |
| 2004/0051448 A1* | 3/2004 | Matsumoto ................. 313/506 |

\* cited by examiner

*Primary Examiner*—Ashok Patel
*Assistant Examiner*—Christopher Raabe
(74) *Attorney, Agent, or Firm*—Morrison & Foerster LLP

(57) ABSTRACT

The invention provides an electroluminescent display device in which purity of R, G, and B colors is prevented from lowering by minimizing white light leakage and color mixture caused by an escape of light to an outside of a color filter layer. An organic EL element driving TFT is formed on an insulating substrate. A first planarization insulating film is formed so as to cover the organic EL element driving TFT. A color filter layer is buried in the first planarization insulating film. An anode layer is connected with the organic EL element driving TFT and extends over the first planarization insulating film. A second planarization insulating film is formed so as to cover end portions of the anode layer. Here, a length of an overlapping area of the color filter layer and the second planarization insulating film is set larger than a sum of thicknesses of the anode layer and the first planarization insulating film. Accordingly, most of light radiated from an organic EL layer can be transmitted through the color filter layer 103.

4 Claims, 5 Drawing Sheets

A > B, θ < 45

ELECTROLUMINESCENT DISPLAY DEVICE

BACKGROUND OF THE INVENTION

1. Field of the Invention

The invention relates to an electroluminescent display device, particularly to an electroluminescent display device having color filter layers.

2. Description of the Related Art

An organic electroluminescent (hereafter, referred to as EL) element is a self-emissive element. An organic EL display device using the organic EL elements is receiving an attention as a new display device substituted for a CRT or an LCD.

FIG. 6 is a schematic cross-sectional view showing a pixel of a full-color organic EL display device of the conventional art. A numeral 200 designates a glass substrate, a numeral 201 designates an organic EL element driving TFT (thin film transistor) formed on the glass substrate 200, and a numeral 202 designates a first planarization insulating film. A numeral 203 designates an anode layer made of ITO (indium tin oxide) which is connected with the TFT 201 and extends over the first planarization insulating film 202, and a numeral 204 designates a second planarization insulating film formed so as to cover end portions of the anode layer 203. A numeral 205 designates R (red), G (green), and B (blue) organic EL layers each formed on the anode layer 203, and a numeral 206 designates a cathode layer formed on the organic EL layers 205.

A glass substrate 207 covers the cathode layer 206. The glass substrate 207 and the glass substrate 200 are attached at their edges to enclose the R, G, and B organic EL layers 205 therein. Here, the R, G, and B organic EL layers 205 are respectively formed by selectively performing vapor-deposition of each of R, G, and B organic EL materials by using a metal mask.

On the other hand, as a method of realizing a full-color organic EL display device without the above R, G, and B organic EL layers 205, using color filter layers has been proposed. In this method, a combination of a white organic EL layer and color filter layers has been employed.

The organic EL display device of this type is described in Japanese Patent Application Publication No. Hei 8-321380.

However, when employing the combination of the white organic EL layer and the color filter layers, the color filter layers must be disposed under the organic EL layer and the second planarization insulating film. In this conventional EL device, light from the white organic EL layer leaks from the display panel so that color purity lowers.

Therefore, an object of the invention is to prevent lowering of purity of R, G, and B colors by minimizing white light leakage and color mixture caused by an escape of light to an outside of a color filter layer.

SUMMARY OF THE INVENTION

The invention provides an electroluminescent display device that includes a plurality of pixels disposed on an insulating substrate, a color filter layer provided in each of the pixels and formed above the insulating substrate, an anode layer disposed above each of the color filter layers, a first planarization insulating film interposed between the color filter layers and the anode layers, a second planarization insulating film disposed on the first planarization insulating film and extending over the anode layers so as to cover end portions of the anode layers, an electroluminescent layer disposed above each of the anode layers, and a cathode layer disposed above the electroluminescent layers. Each of the color filter layers overlaps with the second planarization insulating film by a length that is larger than a sum of a thickness of the anode layer and a thickness of the first planarization insulating film located above the color filter layers.

DETAILED DESCRIPTION OF THE INVENTION

Figure 1:
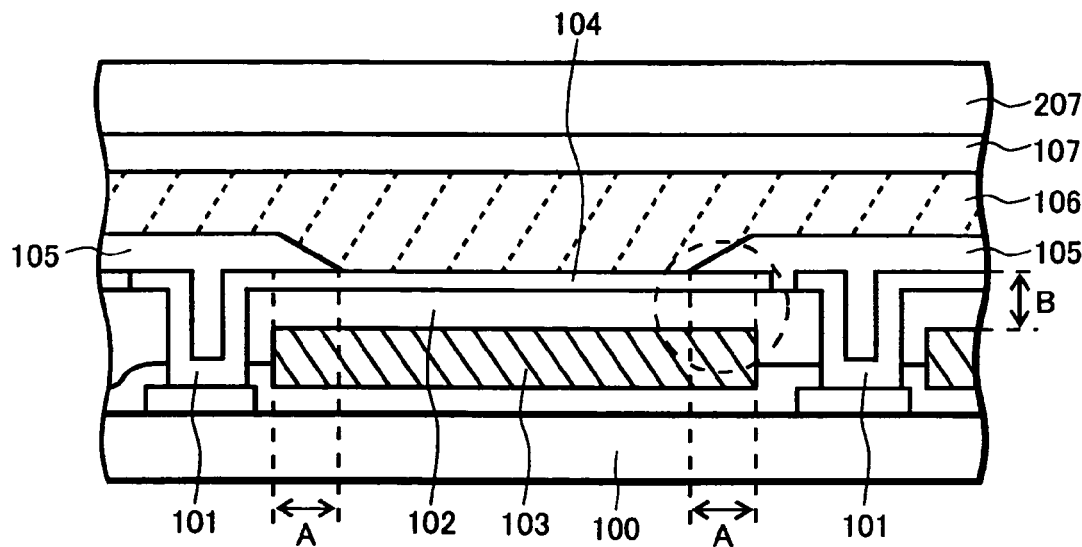
FIG. 1 is a schematic cross-sectional view of a pixel of an organic EL display device of an embodiment of the invention.
Figure 2:
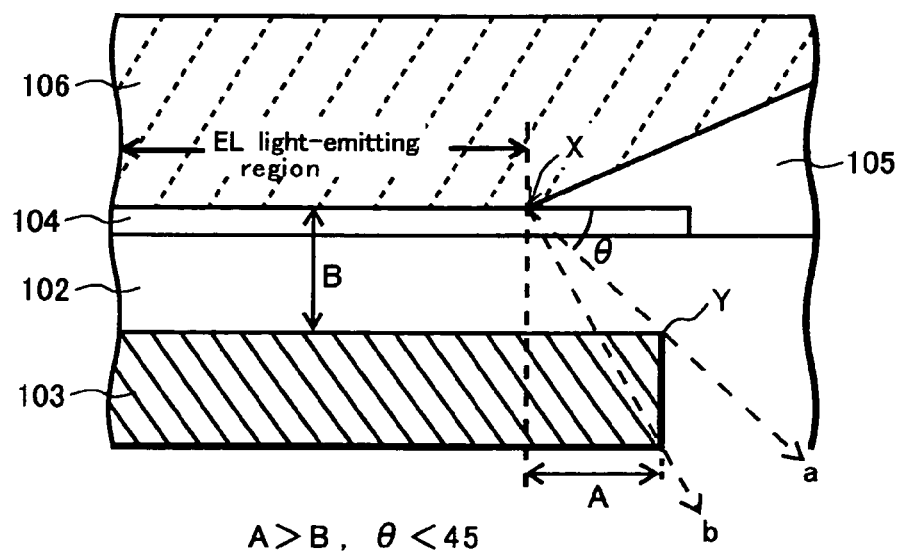
FIG. 2 is an enlarged view of a portion enclosed with a broken line in FIG. 1.

An embodiment of the invention will be described with reference to the drawings in detail. FIG. 1 is a schematic cross-sectional view showing a pixel of an organic EL display device of the embodiment. FIG. 2 is an enlarged view of a portion enclosed with a broken line in FIG. 1. In an actual organic EL display device, a plurality of the pixels is arranged in a matrix.

A numeral 100 designates a transparent insulating substrate such as a glass substrate, a numeral 101 designates an organic EL element driving TFT (thin film transistor) formed on the insulating substrate 100, and a numeral 102 designates a first planarization insulating film. A numeral 103 designates a color filter layer buried in the first planarization insulating film 102, a numeral 104 designates an anode layer made of ITO (indium tin oxide) which is connected with the TFT 101 and extends over the first planarization insulating film 102, and a numeral 105 designates a second planarization insulating film formed so as to cover end portions of the anode layer 104.

The second planarization insulating film 105 is formed with an opening except above the end portions of the anode layer 104. A white organic EL layer 106 is formed on the anode layer 104 exposed in the opening, and a cathode layer 107 is formed on the organic EL layer 106. A glass substrate 207 covers the cathode layer 107, and the glass substrate 207 and the glass substrate 100 are attached at their edges to enclose the organic EL layer 106 therein.

Here, providing the second planarization insulating film 105 is for preventing a short circuit between the anode layer 104 and the cathode layer 107 by a short distance between the end portions of the anode layer 104 and the cathode layer 107.

The color filter layer 103 and the second planarization insulating film 105 overlap by a predetermined length A. This length A is larger than B, which is a sum of thicknesses of the anode layer 104 and the first planarization insulating film 102 above the color filter layer 103.

Accordingly, most of light generated by the white organic EL layer 106 is transmitted through the color filter layer 103 so that the white light leakage and color mixture due to the escape of light to the outside of the color filter layer are minimized to prevent the lowering of purity of R, G, and B colors.

This will be further described in detail. The organic EL layer 106 emits light only at a region which is in contact with the anode layer 104. Therefore, the end of the light-emitting region is the end X of the second planarization insulating film 105 which covers the anode layer 104. The outside region of the light-emitting region (right side of the end X in FIG. 2) is a non-emitting region since the anode layer 104 is not contact with the organic EL layer 106.

Description will be made using the light radiated from the end X as an example since the light radiated from the end X is the most possible source of light leakage. When considering the angle between the surface of the anode layer 104 and the light emitting direction from the end X, the angle θ between the surface of the anode layer 104 and a direction of light "a" shown in FIG. 2 is a critical angle. The light "a" is radiated from the end X and then comes into contact with an upper end Y of the color filter layer 103. When the angle between the surface of the anode layer 104 and the direction of the light radiated from the end X is larger than the critical angle θ (light "b" in FIG. 2, for example), the light is transmitted through the color filter layer 103. When it is smaller than the critical angle θ, the light is not transmitted through the color filter layer 103 but escapes to the outside through the glass substrate 100 as white light leakage.

Here, the above relation can be expressed by an equation, i.e. $\tan \theta = B/A$. For example, when A equals B, θ equals 45 degrees. In this case, when the angle between the surface of the anode layer 104 and the direction of the light radiated from the end X is larger than this critical angle of 45 degrees, the light is transmitted through the color filter layer 103. Experiments have shown that the lowering of purity of R, G, and B colors can be prevented by keeping the relation of A>B and θ<45°.

Figure 3:
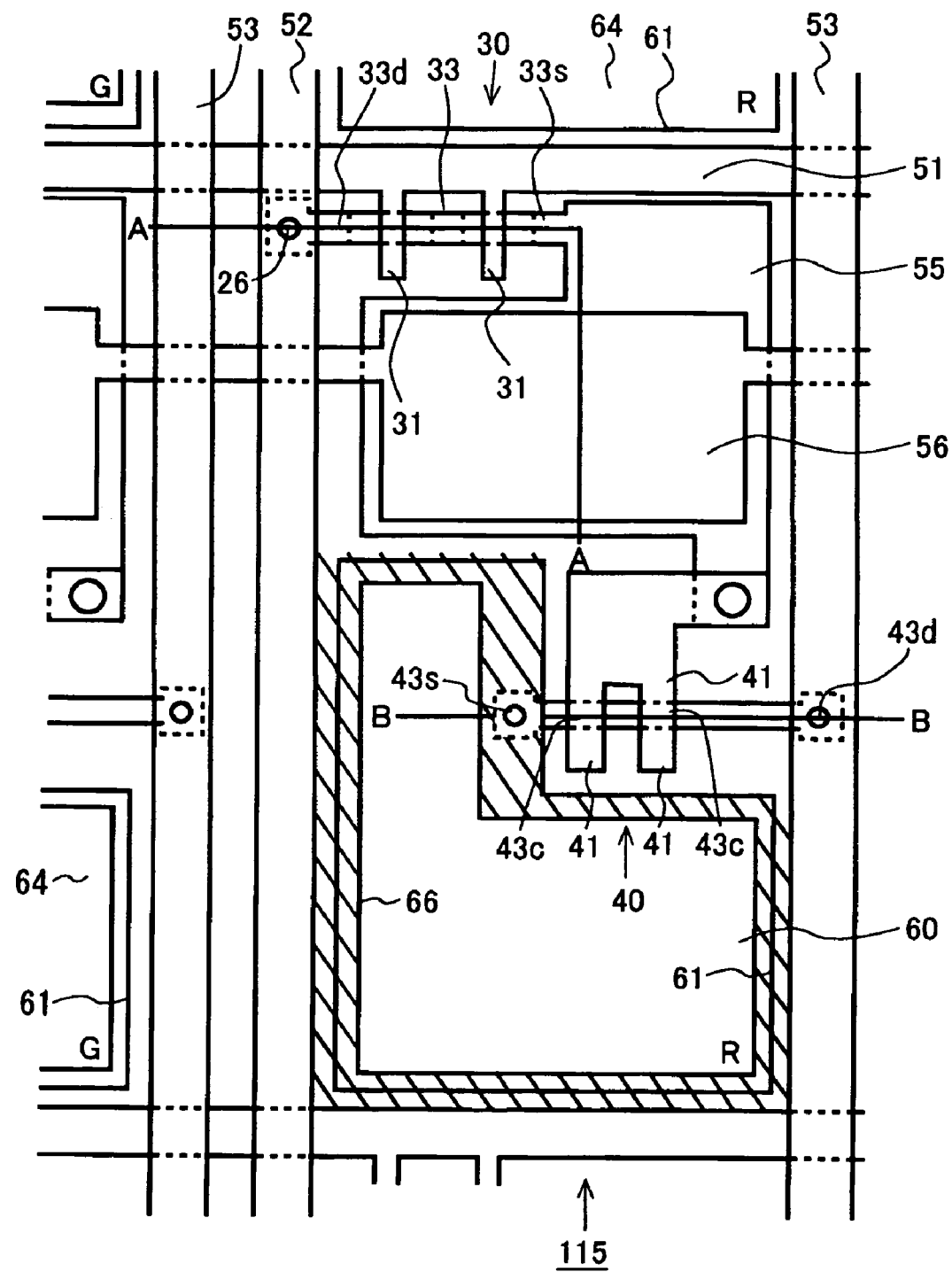
FIG. 3 is a plan view of the pixel and its periphery of the organic EL display device of the embodiment of the invention.
Figure 4:
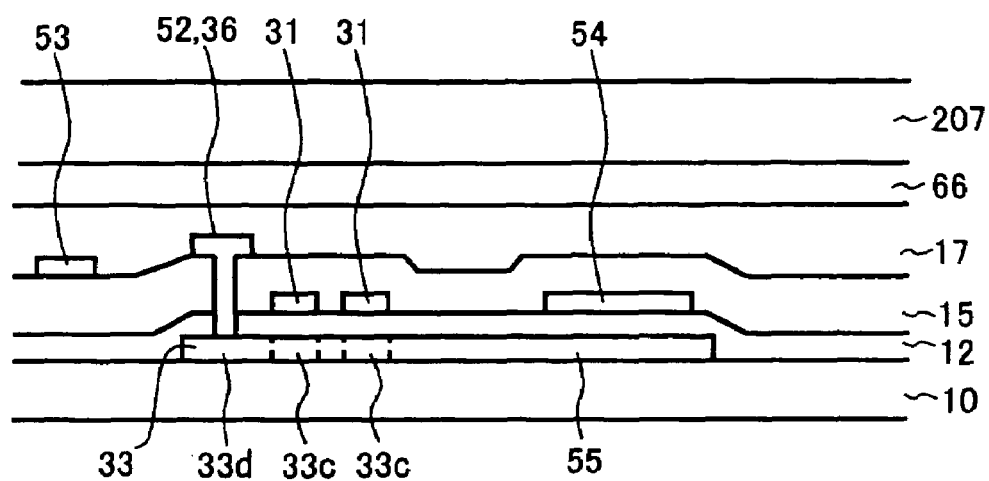
FIG. 4 is a cross-sectional view along line A—A of FIG. 3.
Figure 5:
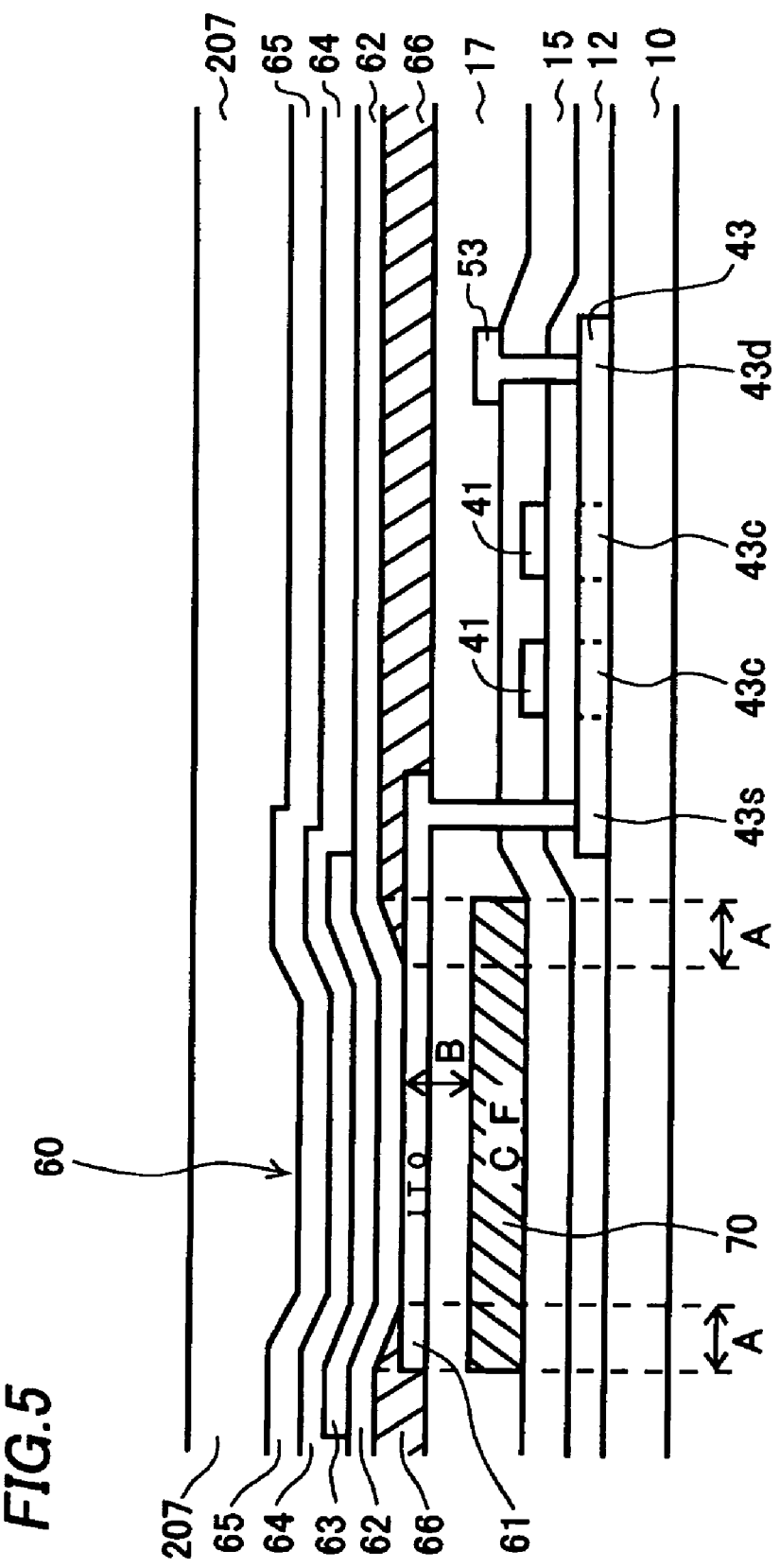
FIG. 5 is a cross-sectional view along line B—B of FIG. 3.
Figure 6:
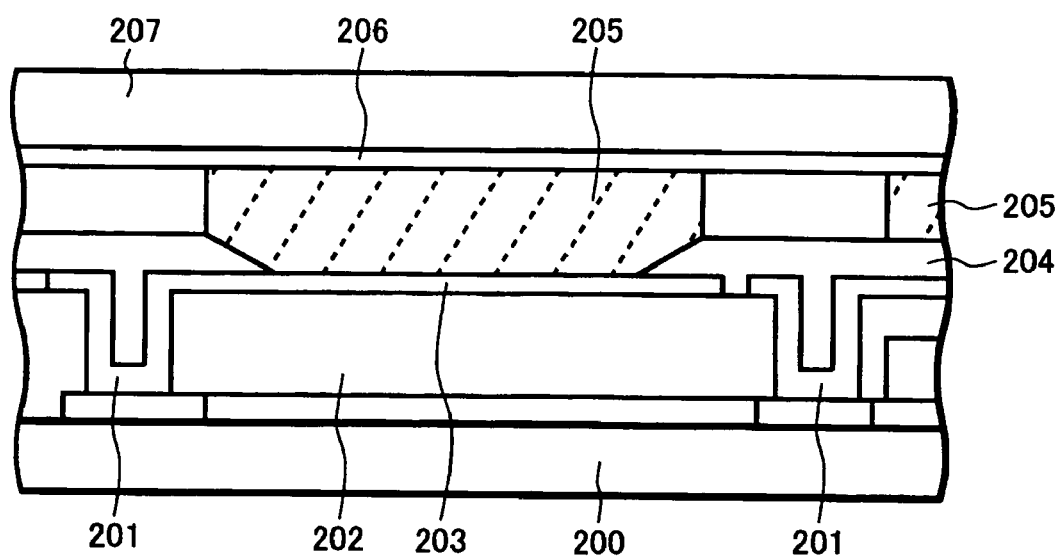
FIG. 6 is a schematic cross-sectional view of a pixel of an organic EL display device of the conventional art.

Next, a structure of the organic EL display device will be described. FIG. 3 is a plan view of the pixel and its periphery of the organic EL display device. FIG. 4 is a cross-sectional view along a line A—A of FIG. 3, and FIG. 5 is a cross-sectional view along a line B—B of FIG. 3.

A pixel 115 is formed in a region enclosed with a gate signal line 51 and a drain signal line 52. A plurality of the pixels 115 is arranged in a matrix.

An organic EL element 60 as a self-emissive element, a switching TFT (thin film transistor) 30 for controlling a timing of supplying an electric current to the organic EL element 60, a driving TFT 40 for supplying an electric current to the organic EL element 60, and a storage capacitor 56 are disposed in the pixel 115. The organic EL element 60 is formed of an anode layer 61, a white EL layer made of a white emissive material, and a cathode layer 65.

The switching TFT 30 is provided in a periphery of an intersection of the both signal lines 51 and 52. A source 33s of the switching TFT 30 serves as a capacitor electrode 55 for forming a capacitor with a storage capacitor electrode line 54 and is connected with a gate electrode 41 of the driving TFT 40. A source 43s of the driving TFT 40 is connected with the anode layer 61 of the organic EL element 60, while a drain 43d is connected with a driving source line 53 as a current source for the organic EL element 60.

A cross-sectional structure of the organic EL display device will be described with reference to FIGS. 4 and 5. The organic EL display device is formed by laminating the TFTs and the organic EL element sequentially on a substrate 10, such as a substrate made of a glass or a synthetic resin, a substrate having a conductivity, or a semiconductor substrate. When using a substrate having a conductivity or a semiconductor substrate as the substrate 10, however, an insulating film made of $SiO_2$ or $SiN_x$ is formed on the substrate 10, and then the switching TFT 30, the driving TFT 40 and the organic EL element 60 are formed thereon. Each of TFTs 30 and 40 has a so-called top gate structure in which a gate electrode is disposed above an active layer with a gate insulating film being interposed therebetween.

The structure of the switching TFT 30 will be described first. As shown in FIG. 4, an amorphous silicon film (hereafter, referred to as an a-Si film) is formed on the insulating substrate 10 made of silica glass or a non-alkali glass by a CVD method and so on. The a-Si film is irradiated with laser beams for melting and recrystalizing to form a poly-silicon film (hereafter, referred to as a p-Si film) as an active layer 33.

On the active layer 33, a single-layer or a multi-layer of an $SiO_2$ film and an $SiN_x$ film is formed as the gate insulating film 12. There are disposed on the gate insulating film 12 the gate signal line 51 made of metal having a high melting point such as Cr (chromium) or Mo (molybdenum) and also serving as a gate electrode 31, the drain signal line 52 made of Al (aluminum), and the driving source line 53 made of Al and serving as a driving source of the organic EL element 60.

An interlayer insulating film 15 laminated with an $SiO_2$ film, an $SiN_x$ film and an $SiO_2$ film sequentially is formed on the whole surfaces of the gate insulating film 12 and the active layer 33. A drain electrode 36 is provided by filling a contact hole provided above a drain 33d with metal such as Al. Furthermore, a first planarization insulating film 17 for planarizing the surface, which is made of organic resin, is formed on the whole surface.

Next, the structure of the driving TFT 40 will be described. As shown in FIG. 5, an active layer 43 formed by poly-crystalizing an a-Si film by radiating laser beams, the gate insulating film 12, and the gate electrode 41 made of a metal having a high melting point, such as Cr or Mo, are formed sequentially on the insulating substrate 10.

A channel 43c, and a source 43s and a drain 43d are provided in the active layer 43. The source 43s and the drain 43d are placed on both sides of the channel 43c. The interlayer insulating film 15 includes an $SiO_2$ film, an $SiN_x$ film and an $SiO_2$ film sequentially formed on the whole surfaces of the gate insulating film 12 and the active layer 43. The driving source line 53 is connected with a driving source by a contact hole provided above the drain 43d.

A color filter layer 70 is formed on the interlayer insulating film 15 adjacent the driving TFT 40. The color filter layer 70 is formed in each of the pixels, having spectral characteristics of each of R, G, and B colors. For example, a pixel R is formed with the color filter layer 70 having spectral characteristics of red.

Furthermore, the planarization insulating film 17 for planarizing the surface, which is made of, for example, an organic resin, is formed on the whole surface. A contact hole is formed in a position corresponding to the source 43s in the planarization insulating film 17. The anode layer 61 of the organic EL element, which is an transparent electrode made of ITO and is in contact with the source 43s through the contact hole, is formed on the planarization insulating film 17. The anode layer 61 is formed on the color filter layer 70 in each of the pixels, being isolated as an island.

A second planarization insulating film 66 is further formed on the first planarization insulating film 17, covering end portions of the anode layer 61. The second planarization insulating film 66 is removed from the light-emitting region of the anode layer 61.

The organic EL element 60 is formed by laminating blue and yellow materials as white light emissive materials in order to emit white light. The organic EL element 60 is formed by laminating the anode layer 61 made of a transparent electrode such as ITO, a hole transport layer 62 made of NPB, an emissive layer 63 formed of yellow emitter layer containing yellow dopant and a blue emitter layer, an electron transport layer 64 made of $Alq^3$(8-tris-hydroxyquinoline aluminum), and the cathode layer 65 made of magnesium-indium alloy, Al or Al alloy, in this order.

The yellow emitter layer containing yellow dopant is formed by adding rubrene as yellow dopant to an NPB (host). The NPB (host) is an abbreviation for N,N'-Di (naphthalene-1-yl)-N,N'-diphenyl-benzidine. The blue emitter layer is made of $Zn (BOX)^2$, which is an abbreviation for bis((2-hydroxyphenyl) benzoxazole) zinc. The cathode layer 65 is covered with the glass substrate 207.

In the organic EL element 60, a hole injected from the anode layer 61 and an electron injected from the cathode layer 65 are recombined in the emissive layer 63, and an exciton is formed by exciting an organic module forming the emissive layer 63. Light is emitted from the emissive layer 63 in a process of radiation of the exciton and then released outside after going through the transparent anode layer 61 to the transparent insulating substrate 10, thereby completing a light-emission.

The color filter layer 70 and the second planarization insulating film 66 overlap by a predetermined length A. This length A is larger than B which is a sum of thicknesses of the anode layer 61 and the first planarization insulating film 17.

Accordingly, most of light radiated by the white light emissive layer 63 is transmitted through the color filter layer 70 so that the white light leakage and color mixture due to the escape of light to the outside of the color filter layer 70 are minimized to prevent the lowering of purity of R, G, and B colors.

What is claimed is:

1. An electroluminescent display device comprising:
   a plurality of pixels disposed on an insulating substrate;
   a color filter layer provided in each of the pixels and formed above the insulating substrate;
   an anode layer disposed above each of the color filter layers;
   a first planarization insulating film interposed between the color filter layers and the anode layers;
   a second planarization insulating film disposed above the first planarization insulating film and extending over the anode layers so as to cover end portions of the anode layers;
   an electroluminescent layer disposed above each of the anode layers; and
   a cathode layer disposed above the electroluminescent layers,
   wherein each of the color filter layers is confined to an area of a corresponding pixel and overlaps with the second planarization insulating film by a length that is larger than a sum of a thickness of the anode layer and a thickness of the first planarization insulating film located above the color filter layers.

2. The electroluminescent display device of claim 1, wherein the electroluminescent layer comprises a white electroluminescent layer.

3. The electroluminescent display device of claim 2, wherein the white electroluminescent layer is an organic electroluminescent layer.

4. An electroluminescent display device comprising:
   a color filter layer that is disposed in a pixel so as not to exceed an area of the pixel;
   a first planarization insulating film disposed on the color filter layer;
   an anode layer disposed on the first planarization insulating film;
   a second planarization insulating film disposed above the first planarization insulating film and extending over the anode layer;
   an electroluminescent layer disposed on the anode layer; and
   a cathode layer disposed above the electroluminescent layer,
   wherein the color filter layer overlaps with the second planarization insulating film by a length that is larger than a sum of a thickness of the anode layer and a thickness of the first planarization insulating film.

* * * * *